United States Patent [19]
Fraas et al.

[11] 3,976,361
[45] Aug. 24, 1976

[54] CHARGE STORAGE DIODE WITH GRADED DEFECT DENSITY PHOTOCAPACITIVE LAYER

[75] Inventors: Lewis M. Fraas, Malibu; William P. Bleha, Jr., Pacific Palisades, both of Calif.

[73] Assignee: Hughes Aircraft Company, Culver City, Calif.

[22] Filed: Oct. 22, 1975

[21] Appl. No.: 625,331

Related U.S. Application Data

[63] Continuation-in-part of Ser. No. 524,596, Nov. 18, 1974, abandoned.

[52] U.S. Cl................................. 350/160 LC; 96/1 PC; 96/1.5; 357/30; 357/90
[51] Int. Cl.².......................................... G02F 1/13
[58] Field of Search ............. 350/160 LC; 96/1 PC, 96/1.5; 357/30, 90; 250/213 R

[56] References Cited
UNITED STATES PATENTS
3,824,002   7/1964   Beard et al. ................. 350/160 LC

*Primary Examiner*—Edward S. Bauer
*Attorney, Agent, or Firm*—Donald C. Keaveney; W. H. MacAllister

[57] ABSTRACT

In a light actuated device such as an alternating current driven light valve or other display device requiring the photocapacitance of a light responsive layer in a photodiode to be modulated in response to changes in incident or writing light, sensitivity is an important factor, especially when a cathode ray tube phosphor image is the source of such light. This sensitivity can be improved by more than an order of magnitude by using a graded defect center (as defined hereinbelow) concentration, graded band gap layer in said diode which can produce a graded optical absorption coefficient between two regions of the layer so that most of the incident light is absorbed in the region near the semiconductor rectifying junction of the diode to store charge near this junction by this or any similar action. In one particular embodiment disclosed a cadmium sulfide photoconductor is used and the defect center density and hence the optical absorption coefficient for the incident light beam in the light sensitive region is graded from a low value on the light input side to a higher value near the junction forming interface with a cadmium telluride light blocking layer by varying the defect concentration in the cadmium sulfide during the film preparation by progressively lowering the temperature during sputter deposition. In a second embodiment this grading is accomplished by alloying cadmium sulfide with cadmium selenide near the cadmium telluride region thus introducing defect centers and lowering the absorption band edge. In both embodiments charge carriers are generated which are stored in the region adjacent to the junction interface and thereby change the photocapacitive depletion width adjacent to the junction to enhance the sensitivity of the diode.

16 Claims, 17 Drawing Figures

Fig. 13.

Table I.

(1) $\quad Q_\delta = \bar{n}_f \delta$ (2) $\quad V = \dfrac{Q^2}{2\epsilon \bar{n}} \qquad Q \leq Q(\bar{n})$ (3) $\quad V = \dfrac{\bar{n}\delta^2}{2\epsilon} + \dfrac{(Q - \bar{n})D}{\epsilon} \qquad Q \geq Q_\delta$ (4) $\quad V_o = V_s \left(1 - \dfrac{Z_o \, Sw.R.}{Z_{sd} + Z_o}\right)$ (5) $\quad F = \left[\beta_{n_r} \alpha^2 \dfrac{N_s}{N_c} e^{E_s/kT}\right](\bar{n}_f)^2$ (6) $\quad \tau_{rise} = \dfrac{\bar{n}_s}{F} = \dfrac{1}{\beta_{n_r} \alpha \bar{n}_f}$ (7) $\quad \tau_{decay} = \dfrac{1}{\beta_{n_r} \alpha \bar{n}_f} = \dfrac{N_s \exp(E_s/kT)}{N_c \beta_{n_r} \alpha (N_r - n_r)} = P_s^{-1}$

SYMBOL DEFINITIONS:

| Symbol | Definition |
|---|---|
| $Q_\delta$ | Total shallow trap center charge in the CdS film |
| $\bar{n}_f$ | Space averaged shallow trap center electron population density |
| $\delta$ | Thickness of high shallow trap density, high absorptive CdS film region |
| $V$ | Instantaneous back bias voltage on CdS film |
| $Q$ | Instantaneous CdS electrode charge |
| $\epsilon$ | CdS film dielectric constant |
| $D$ | Total CdS film thickness |
| $V_s$ | Total peak supply voltage applied to AC light valve |
| $V_o$ | Voltage amplitude across the CdS film |
| $Z_o$ | Impedance seen by photo sensor, i.e., the light valve mirror and liquid crystal combination (per unit area) |
| Sw. R. | Current Switching Ratio, i.e., the ratio of peak current when the photosensor is illuminated to peak current in the absence of illumination |
| $Z_{dark}$ | Total dark state light valve impedance per unit area $Z_{dark} = Z_{sd} + Z_o$ |
| $\beta_{nr}$ | Capture coefficient for an electron by a CdS recombination center |
| $F$ | Density of electron-hole pairs created per second by optical excitation across the band gap |
| $\alpha$ | The fraction of a cycle an electron from a shallow trap center is free to move in the CdS film before being swept out to the electrode |
| $T$ | Temperature |
| $N_s$ | Density of slow deep electron traps in CdS |
| $E_s$ | Energy difference between deep trap level and bottom of conduction band |
| $N_c$ | Effective density of states in lowest kT wide part of the conduction band |
| $f$ | AC frequency |
| $\tau_{rise}$ | Light induced photosensor current rise time |
| $\tau_{decay}$ | Photosensor decay time |
| $P_s^{-1}$ | Thermal escape time |
| $\bar{n}_s$ | Space averaged deep trap center electron population density |

Fig. 14.  Table II. Switching Ratio - 4 μm Liquid Crystal

| Wavelength | Switching Ratio | |
|---|---|---|
| Red - 6000 Å | 1.05 | 2 kHz |
| Green - 5260 Å | 1.77 | 100 μW/cm² |

Fig. 15.

Table III. Theoretical and Experimental ac Light Valve Gray Scale Data

| Light Intensity, μW/cm² | Predicted Switching Ratio | Measured Switching Ratio | |
|---|---|---|---|
| 10 | 1.2 | 1.1 | |
| 40 | 1.37 | 1.3 | 2 kHz |
| 100 | 1.47 | 1.5 | |
| 10 | 1.38 | 1.43 | |
| 40 | 1.68 | 1.7 | 200 Hz |
| 100 | 1.92 | 1.85 | |

Fig. 16.

Table IV. Photosensor Response Time Data as a Function of Light Level

| Light Intensity | Switching Ratio | On Time | Off Time | |
|---|---|---|---|---|
| 10 μW/cm² | 1.1 | 250 msec | 30 msec | |
| 40 | 1.3 | 50 | 30 | |
| 100 | 1.5 | 20 | 50 | 2 kHz |
| 400 | 1.75 | 10 | 30 | |
| Saturated | 2.1 | ≤5 | 15 | |

CHARGE STORAGE DIODE WITH GRADED DEFECT DENSITY PHOTOCAPACITIVE LAYER

RELATED APPLICATION

This application is a continuation-in-part of our copending application Ser. No. 524,596 filed Nov. 18, 1974, entitled "Graded Gap, Graded Defect Concentration Photocapacitive layer" (now abandoned) and assigned to the same assignee as is the present application.

FIELD OF THE INVENTION

This invention pertains generally to light image amplifiers for display devices and in particular to a charge storage diode for such devices which require a semiconductor photosensor the capacitance of which is modulated in accordance with variations of intensity of an input light image.

BACKGROUND OF THE INVENTION

Prior Art

U.S. Pat. No. 3,824,002 in the name of Terry D. Beard, entitled "Alternating Current Liquid Crystal Light Valve" and assigned to the same assignee as the present invention teaches the basic principles of operation of an alternating current liquid crystal light valve which requires that a photoconductor be impedance-matched to the liquid crystal, the photocapacitance of the photoconductor being modulated in response to an input light.

In one preferred embodiment described in that patent, cadmium sulfide was thermally deposited on a heated substrate and subsequently baked in a hydrogen sulfide atmosphere to bring about a more nearly stoichiometric film whereupon cadmium telluride film was deposited in a vacuum onto the cadmium sulfide. In the embodiment disclosed by Beard, the cadmium sulfide film was about 2 to 12 microns thick and the cadmium telluride film was about 2 microns thick and was very opaque to the light to which cadmium sulfide is photosensitive. Such a structure has a photo-capacitive effect which apparently is in part the result of a heterojunction being formed between the cadmium sulfide and the cadmium telluride resulting from the decreased width of the depletion region which, in turn, is the result of the trapping at the junction of "holes" (positive charges) created by light excitation within the cadmium sulfide. See, for example, lines 50 to 59 of column 2 lines 19 through 30 of column 5 of the Beard patent.

It is to be noted that a uniform photoconductor films such as the cadmium sulfide used in the Beard patent always produces an exponential decrease in light intensity as a function of distance into the film which thus results in progressively less efficient light coupling for narrower depletion widths. Furthermore, any high purity, highly stoichiometric semiconductor film generally possesses a sharp spectral response which is required for low recombination velocities. In the case of cadmium sulfide, the spectral response is much too narrow for efficient coupling to a P-1 phosphor typical of commercial cathode ray tubes; and in fact, only a 10 percent efficiency results.

It is also to be noted that the incident light image is formed in the depletion width region and, the resolution of the device is determined by the distance from the depletion width region to the liquid crystal or other material being photocapacitively coupled to the photoconductor. Uniform films with broader spectral response generally possess higher deep trap densities and higher recombination center densities, which results in lower light injected carrier efficiencies.

Present Invention

Accordingly, one object of the present invention is to provide a photocapacitive light sensor of high sensitivity comprising a charge storage semiconductor diode.

A second object of the present invention is to provide such a photodiode having a broad spectral response with non-exponential carrier generation and low recombination velocities.

A third object of the present invention is to provide such a photodiode usable in high resolution display devices.

A fourth object of the present invention is to provide such a photodiode having high carrier injection efficiency.

A fifth object of the present invention is to provide such a photodiode usable in a high frequency alternating current device which is made possible by enhanced light-switching photocapacitive effects.

A broad object of the present invention is to provide such a photodiode structure which improves the performance of a high frequency alternating current display device.

The invention which satisfies these and other objects comprises a photodiode wherein the interface (in the particular exemplary embodiment described) between a film of cadmium sulfide photoconductor and a cadmium telluride light-blocking layer has adjacent to it a region of the photoconductor layer which has a higher density of defect centers than the rest of the photoconductor has. This region is characterized by a high incident light absorption coefficient and a high carrier injection coefficient. This high defect center density, high light absorption, high carrier injection region may be formed either by alloying cadmium sulfide with cadmium selenide near the interface, thus varying or grading the band gap across the cadmium sulfide film and introducing defect centers in the form of selenium atoms or by varying the defect center density of the cadmium sulfide itself across its thickness by progressively lowering the temperature during film preparation. Such a region may also be formed in other photoconductors/photocapacitors (such as ZnS, GaAs, and Si with photoresponse in different spectral regions) in accordance with the present invention.

BRIEF DESCRIPTION OF THE DRAWINGS

FIG. 13 shows Table I which lists the descriptive equations for the device and defines the terms thereof.

FIG. 14 shows Table II which lists switching ratios for a 4 $\mu$m liquid crystal cell at various wavelengths.

FIG. 15 shows Table III which gives theoretical and experimental AC light valve gray scale data.

FIG. 16 shows Table IV which gives photosensor response time as a function of light level.

DETAILED DESCRIPTION

Figure 1:
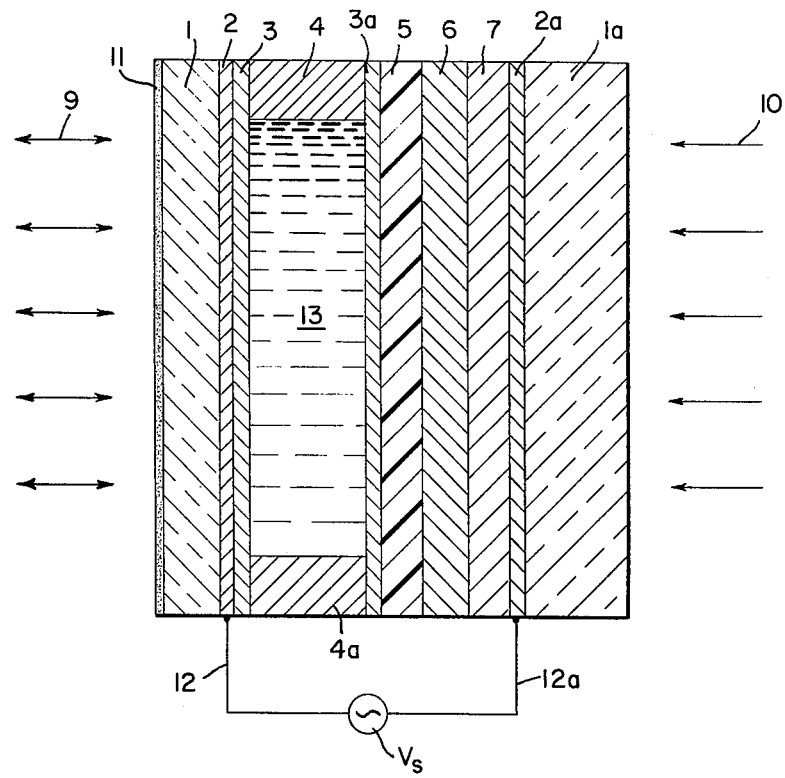
FIG. 1 includes a reproduction of FIG. 1 in Beard U.S. Pat. No. 3,824,002 and shows an alternating current driven light valve.

Referring now with particularity to FIG. 1 wherein an alternating current liquid crystal light valve of the prior art such as that taught in the above cited Beard patent is illustrated, it can be seen that the photo-activated AC liquid crystal valve of FIG. 1 is a planar multilayered structure that can impress an AC voltage (which in operation is connected between inputs 12 and 12a to transparent electrodes 2 and 2a, respectively) on a liquid crystal layer 13 in direct relationship, both spatially and temporaly, to the variations of intensity of an incident input light image, 10. Since this planar device has no structurally defined resolution elements and the component thin film layers have high sheet resistance, high resolution output imagery 9 is possible. For a more detailed description of AC liquid crystal light valves, reference is made to the above cited Beard patent which particularly stresses the necessity for matching the AC impedance of the photoconductor with that of the liquid crystal or other voltage responsive material being used.

The light valve is fabricated on a glass substrate 1a or on other optical quality substrate material that is transparent to incident light 10 over the spectral band where the photoconductor 7 is sensitive. A fiber optic face plate can also be used for this purpose. On the substrate 1a, a thin transparent conductor 2a, typically of indium tin oxide (ITO) is deposited. The sheet resistance of this film is preferably 1 to $10^3$ ohms per square, with a value determined by the requirement that there be no appreciable AC voltage variation across the surface of the film when the device is operated with a particular AC frequency or frequencies being used in a particular embodiment.

The next film is a high impedance photoconductor layer 7 that possesses high sensitivity to a low level input image. In the case of a light valve to be used in the "reflective mode" display, the next layer is an opaque light-blocking layer 6 that acts to prevent projection light 9 which forms the output imagery from reaching the photoconductor 7.

The next element of the device is a multilayered dielectric mirror 5 consisting of alternating quarter-wave films of high and low reflective index of refraction. The use of such a dielectric mirror requires the use of alternating currents to operate the device as it will block DC voltages from falling across the liquid crystal.

The final layer on substrate 1a is a passivating dielectric film 3 that is inert to electrochemical or mechanical interaction with the liquid crystal being used.

The alternating current liquid crystal light valve of FIG. 1 also requires a counter electrode consisting of a glass plate 1 upon which counter electrode 2 is deposited with a passivating dielectric film 3 being additionally deposited. Located between passivating films 3 and 3a is the liquid crystal material 13. The thickness of the liquid crystal is determined by spacers 4 and 4a.

Figure 2:
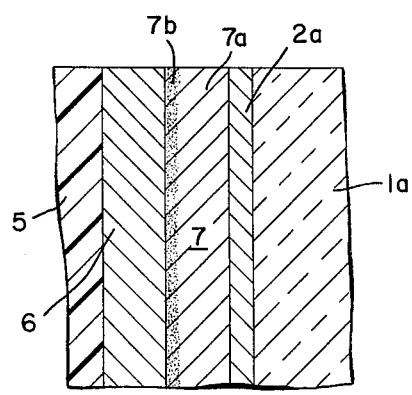
FIG. 2 shows a portion of the light valve of FIG. 1 modified in accordance with the present invention.

Referring now with greater particularity to FIG. 2 wherein the improvement of the present invention is illustrated in detail, it may be seen that within the photoconductor photocapacitive layer 7 there is a region 7a of relatively pure cadmium sulfide which has a low defect center density and a low light absorption coefficient in juxtaposition with a region 7b having a higher defect center density and absorption coefficient. Region 7b may be produced in one embodiment, for example, by the addition of selenium to the sulfur in the film deposition resulting in an alloy whose chemical composition may be represented by the formula $CdS_{1-x}Se_x$ whereby the selenium atoms form detect centers. This will produce a region, 7b, in the vicinity of the interface between the photoconductor layer 7 and the cadmium telluride light blocking layer 6 that is more absorbing to wavelengths greater than the fundamental absorption edge of the CdS than is the bulk of the CdS film. We can refer to this higher absorption region 7b as "orange" in comparison to the characteristic "yellow" absorption of stoichiometric photoconductor such as the CdS in region 7a. This "orange" region absorbs the major portion of the incident light 10 which may emanate from a cathode ray tube or other light source with the advantageous result that less incident light produces a larger change in the photocapacitive depletion width, which in turn results in greater device sensitivity. Inasmuch as most of the incident light is absorbed in region 7b, it is possible to make the relatively pure cadmium sulfide region 7a (which will be yellow in color) much thicker than shown in the prior art such as the Beard patent which has the advantage of lowering the dark current of the device since the dark current level is determined by the dark state depletion width, and this is determined by the total thickness of region 7a and 7b. The aforementioned cadmium sulfide, cadmium selenide alloy can readily be accomplished by reactively sputtering a cadmium sulfide target in a hydrogen sulfide atmosphere and then, in the final steps, sputtering the target in a hydrogen selenide atmosphere thereby producing a graded band gap structure having the required chemical formula. It is also possible to produce such an alloy structure utilizing dual boat evaporation followed by a hydrogen sulfide heat-treating step, or dual target sputtering. Either process first deposits CdS for 7a and then $CdS_{1-x}Se_x$ for 7b.

In another embodiment both regions 7a and 7b may consist solely of CdS. In this case the variation in defect center density between regions 7a and 7b is achieved by progressively lowering the temperature of substrate 1a – 2a during the sputter deposition of layer 7 thereon. In this case the defect centers produced comprise both shallow electron traps and recombination centers. These defect centers produce the same charge storage effect as do defect centers consisting of the alloy atoms described above. Hence the term "defect center" is used herein to mean either an atom not normally contained in the intrinsic semiconductor which acts as a dopant or serves to alloy with the semiconductor, or a shallow charge carrier (electron or hole) trap in the semiconductor, or a recombination center in the semiconductor or any combination of these.

As noted previously, the present invention, although described in an embodiment utilizing CdS, may be extended to other photoconductors such as ZnS, GaAs, or Si, which are photoresponsive in other spectral regions. Furthermore it will be understood that devices in accordance with the present invention can be used in systems other than that shown by Beard which is referred to solely by way of example. In particular it will be understood that while Beard refers to a liquid crystal layer 6 to 12 microns thick operated in the dynamic scattering mode, thinner liquid crystal layers may be used and may be operated in any mode including the field effect activated mode.

Furthermore, in addition to its application to the liquid crystal device of the type shown in the Beard patent which has been used as the exemplary preferred embodiment, it should be understood that the photosensor is applicable to a variety of display devices that consist of a light sensitive voltage gating layer and an adjacent layer of some voltage or field activated light modulating medium, both sandwiched between a pair of transparent electrodes. Our present best understanding and belief concerning the mode of operation of the photosensor structure is set forth above in describing the device as an alternating current light activated light valve for light activated displays wherein the AC photocapacitance associated with a light responsive layer plays a role of major importance and is explained in greater detail below in connection with experimental data. Although this photocapacity is of specific importance for AC liquid crystal displays where AC drive voltages are used to avoid electrochemical degradation, it is also of general importance for real time field effect displays where frames are exposed and voltages erased at finite frame rate. The above described mode of operation describes the photosensitivity of the photo-sensor structure in terms of the depletion width photo-capacity of the structure formed by the two layers 6 and 7a –7b.

The device is distinguished over the device shown in the Beard patent by several operating characteristics and advantages. In order to drive the Beard device from a cathode ray tube, a high-intensity relatively expensive CRT system has been required. With the present device experiments have shown that the substrate photodiode sensitivity can be improved by more than an order of magnitude. Appreciable switching ratios have been obtained with less than 50 microwatts per square centimeter of a spectral band equivalent to that of the conventional P-1 phosphor of commercial cathode ray tubes. Standard commercial inexpensive CRT systems can supply approximately 100 microwatts per square centimeter. The spectral band of such P-1 phosphor commercial CRT's is herein defined as a wavelength band defined by a bell curve having a peak value at 525 nanometers, the full width of the curve at half maximum value being 45 nanometers.

Additionally, the device provides a broader spectral response than does the Beard device. A uniform film always produces an exponential decrease in light intensity thus allowing progressively less efficient light coupling for narrower depletion widths. Furthermore, a high-efficiency semiconductor film generally possesses a sharp spectral response (required for low recombination velocities). In particular, good crystalline cadmium sulfide films possess a spectral response much too narrow for good coupling to a cathode ray tube P-1 phosphor. Grading the film in accordance with the present invention allows broad spectral response with non-exponential carrier generation and low recombination velocities.

The photosensor of the present invention also affords high resolution with low dark current. Since the cathode ray tube image is formed in the depletion width region, the light valve resolution is determined by the distance from the depletion width to the liquid crystal. In the graded structure, the cathode ray tube light or other input image light is largely absorbed in the orange region near the cadmium telluride interface. The image is formed there. The yellow region can be made thicker lowering the dark current since the dark current level is determined by the dark state depletion width and this consists of the yellow plus the orange film thickness.

The device in the present invention also affords higher carrier injection efficiency. Uniform films with broader spectral response generally possess higher deep trap densities and higher recombination center densities. Both of these centers produce lower light injected carrier efficiencies. These center densities can be lowered in the graded gap structure of the present photosenser. In the graded defect orange on yellow film, process methods producing shallow defects are preferred.

Finally, as noted above, the device of the present invention affords good high-frequency photocapacity. As has been indicated above, the improved sensitivity results from an enhanced light switching photocapacity effect. In the graded defect structure the photocapacity will remain high at higher frequencies if the shallow defects communicate fast enough with the conduction band. They thus empty and fill at the rates required by the higher frequencies. In the graded band structure, the shallow level energy in effect becomes zero and good high frequency switching ratios are obtained.

By way of a specific example of a presently preferred device embodying the invention experimental data are presented for the substrate mounted photodiode structure presently used with an AC driven liquid crystal projection light valve. This structure includes the elements shown in FIGS. 1 and 2 and consists of a thin film 7 (sputter deposited) of n-type CdS on which is evaporated a thin film of p-type CdTe 6. There is presented below a conceptual model which, for purposes of analysis by techniques of theoretical solid state physcis, describes the photosensitivity of this structure in terms of the depletion width photo-capacity of the charge storage diode formed by these two layers.

By assuming an electronic defect center structure which, for this pure CdS embodiment example, consists of fast and slow electron trap levels and a recombination level, as in the case of a photoconductor, the charge stored in the diode can be related to image actuating light intensity. This provides descriptive information on device response time, gray scale, and sensitivity.

The response time data are of particular interest because they show that the projection light valve photosensor is capable of operation at near TV rates. The agreement of the experimental data with the model and extrapolation from the model imply that large improvements in sensitivity and response time are still quite possible.

Within the liquid crystal display device context, this new charge storage photosensor has the salient advantage of providing a light activated current switching ratio, defined as ($i_{on}/i_{off}$) which is hereinafter designated as Sw. R.), which is nearly independent of operating frequency. This is a striking advantage because, in order to achieve any reasonable lifetime, the liquid crystal has to be driven by an AC current source and the AC frequency has to be well above TV rates (for TV devices) in order to prevent beat frequency effects. Under these conditions, the dark capacitive current of the thin films increases very significantly. A simple calculation shows that a photodiode substrate with unity (or less) quantum efficiency will have very limited switching ratios at frequencies of 200 Hz or higher. We obtain almost frequency independent switching ratios in the range of $10^2$ to $10^4$ Hz. The model explains this behavior in terms of stored charge in the depletion layers in the form of holes at recombination centers. The hole lifetimes are much longer than the driving voltage period. Therefore, an electron flows back and forth many times before recombining with a hole. In fact, if the recombination time is independent of the frequency, the number of holeelectron separations is proportional to frequency. This produces a photocurrent which is proportional to frequency in the same fashion as is the capacitive dark current. As a result, the ratio of these two, which is the switching ratio, is frequency independent. Macroscopically, the effect of photocurrent proportional to the frequency can also be described as a photocapacitance in the electrical equivalent circuit.

EXEMPLARY DEVICE ANALYSIS

I. INTRODUCTION

This section of the specification describes the experimental characteristics of the specific exemplary imaging photosensor device used in an AC liquid crystal light valve projection display system of the type described by Beard et. al [T. D. Beard, W. P. Bleha, and S. Y. Wong, Appl. Phys. Lett. 22, 90 (1973).]

When a low intensity writing image 10 from a CRT, for example, illuminates the CdS/CdTe light sensitive element, the AC voltage applied between electrodes 2 and 2a of a light valve as in FIG. 1 is spatially gated to the liquid crystal layer 13. The liquid crystal, in turn, acted on by this spatially varying voltage, modulates the high intensity projection light 9 to form a replica image. The total light valve performance, then, is gauged by two factors: (1) The voltage switching response of the light sensitive element to the writing light image, and (2) The liquid crystal modulation effect on the projection light in response to the photosenser supplied voltage.

In this invention, the focus is on the experimental response of the light sensitive photodiode element comprising the charge storage diode formed by layers 7 and 6. After a discussion of photosensor fabrication (Section II) the theoretical model is briefly described (Section III) and experimental data are presented and evaluated with this model as a base (Sections IV to VI).

II. PHOTOSENSOR FABRICATION PROCESS

The photosenser diode used in the AC light valve consists of three film layers deposited in succession on a glass substrate 1a. These films are, in order of deposition:

a. A 40 millimicron thick e-beam evaporated indium-tin oxide transparent electrode 2a.

b. A 16 $\mu$m thick reactively sputtered n-type CdS film 7.

c. A 2 $\mu$m thick thermally deposited p-type CdTe film 6.

The CdS film is prepared by reactive sputtering in an $H_2S$/Ar atmosphere in a fashion similar to that described by Frazer and Melchior. [D.B. Fraser and H. Melchior, J. Appl. Phys. 43, 3120 (1972).] The sputtering variables have the following values:

| | |
|---|---|
| Deposition rate: | 1.3 to 1.5 $\mu$m/hour. |
| Argon pressure: | 14 $\mu$m to 16 $\mu$m. |
| $H_2S$ concentration: | 2%. |
| Bias: | Substrates grounded. |
| Residual gas Pressure: | $\leq 2 \times 10^{-5}$ Torr. |
| Substrate temperature: | Varied during deposition. |

Figure 3:
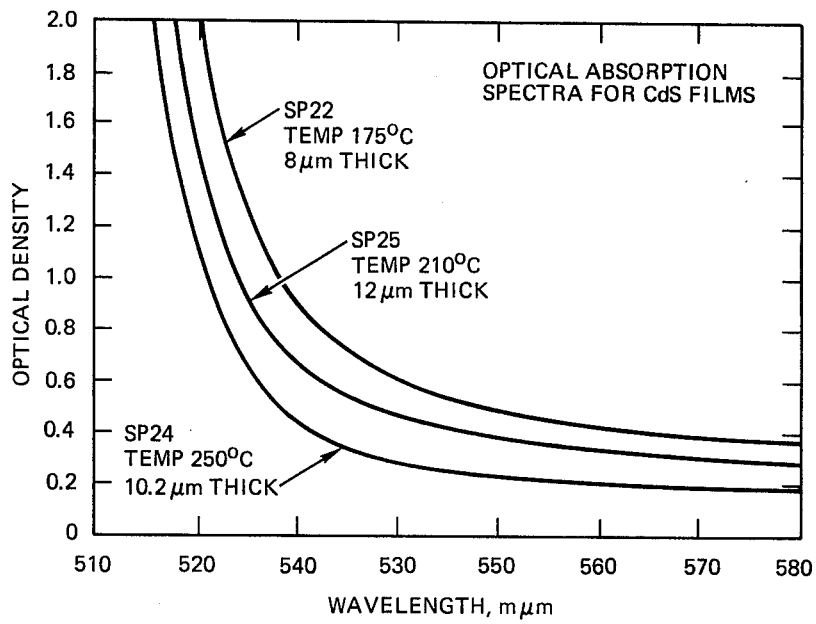
FIG. 3 is a graph showing optical absorption spectra for sputtered CdS films with substrate temperature as a parameter for one specific exemplary device. Note that as the temperature is lowered, the near band edge absorption increases.

Graded absorption films are prepared by varying the substrate temperature during the CdS film deposition. The initially high (225°C) substrate temperature produces a highly insulating, low electron trap density, and shorter wavelength absorption edge layer 7a, while the final low substrate temperature (175°C) produces a shifted absorption edge, high shallow trap density layer 7 b. This effect of substrate temperature on the CdS film optical absorption edge is illustrated by the spectra of FIG. 3. In practice region 7b is about one fourth of the thickness of layer 7 while region 7a is about three fourths the total thickness of layer 7 which in this example is given as 16 $\mu$m, but it will be understood that this can be varied to suit design requirements. Thicknesses in the range of 10 $\mu$m to 20$\mu$m are clearly practical.

After CdS film 7 deposition, the film is chemomechanically polished and a p-type CdTe film 6 is deposited thus forming the n-p diode structure.

III. PHOTOSENSOR CONCEPTUAL MODEL

The photosensor element in the light valve structure of FIGS. 1 and 2 is the large area diode formed by the p-type CdTe and n-type Cds films 6 and 7 respectively. The key element controlling the operation of this diode structure is the AC capacitive impedance associated with the diode depletion width. It has been postulated that a light-injected charge controls this depletion width capacity. The way this occurs is described below.

Figure 4:
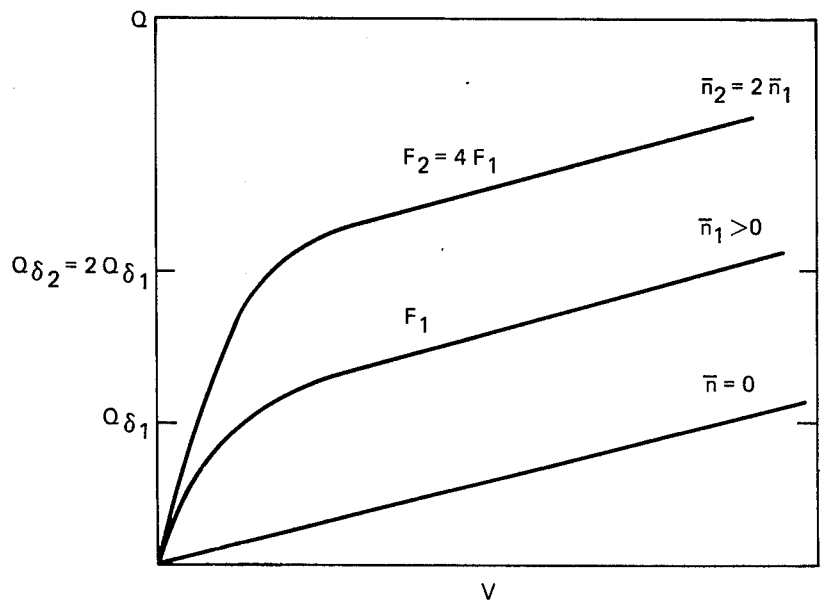
FIG. 4 is a graph showing theoretical plate charge versus back bias voltage curves for a light activated charge storage diode. The light induced electron-hole pair injection rate is the curve parameter.

Since the key element in the photosensor operation is the depletion width of the charge storage diode, the characteristic diode curves are the Q versus V curves. These curves are shown in FIG. 4. In these curves, V is the diode back bias voltage and Q is the charge on the indium tin oxide (ITO) ohmic contact 2a to the CdS film 7. Light intensity (which controls filled donor state density, $\bar{n}_t$) is the parameter producing the family of curves shown.

First, we consider the dark state. In this state, the CdS layer 7 in the diode has a resistivity such that the diode depletion width sweeps easily from the CdS/CdTe interface all the way through the CdS film (~16 μm) for very small voltages, (V). Thus, in the dark, the AC impedance of the photosensor is that of a 16 μm thick CdS dielectric parallel plate capacitor. So, for the dark case, the Q versus V curve in FIG. 4 is a straight line.

Second, we consider the illuminated state. Then, when light falls on the diode, the photons create electron-hole pairs in the bulk of the CdS film near the CdTe interface. The injected holes are captured in the CdS at recombination centers forming a stored charge. If the diode is in the zero back bias voltage condition, the light injected electrons are captured at trap centers in the CdS and the hole charge is compensated. Thus, the ITO plate charge is zero at zero voltage. As the voltage varies from zero, however, since some of the electrons are mobile while the holes are not, the shallow electron traps act effectively as donors, and the depletion width varies with voltage in a fashion controlled by an effective donor concentration created by light injected electrons captured at shallow trap centers. This is the non-linear region of each illuminated diode curve on FIG. 4. When the voltage reaches the point that the shallow trap centers are depleted, the charge has been removed from the bulk of the film and the film will again charge as a 16 μm dielectric capacitor, and the Q versus V curve becomes a straight line parallel to the dark state Q versus V curve.

It is clear from the above discussion that the electron population at the shallow trap centers is the light dependent quantity which characterizes the photosensor response. This quantity can be related to light intensity and sensor on and off times by assuming a three level model for the CdS film. These three levels are: (1) a recombination center, (2) a shallow trap center, and (3) a deep trap center.

The deep trap center plays an important role in limiting performance. Referring to the earlier discussion, not all electrons trapped are free to move at the frequency of the applied AC voltage. Thus they limit sensitivity, as many of the light-injected electron-hole pairs are then ineffective.

The equations relating to sensitivity and sensor on and off times developed from this three level model are summarized in Table I in FIG. 13 of the drawings. It is worth noting that these equations parallel the equations for a photoconductor if the conduction band free electron population density for the photoconductor is replaced by the quantity, $\alpha \bar{n}_f$. This quantity arises because all of the electrons trapped at shallow centers, $\bar{n}_f$, are free to move for a fraction of a period, $\alpha$, each cycle before they are swept to the electrode. So, $\alpha \bar{n}_f$ is the effective average free electron population density.

As noted earlier, there is an advantage in grading the optical absorption coefficient of the CdS film 7 so that the region 7b near the CdTe interface is more highly absorptive. This has the advantage of higher sensitivity because of more uniform bulk carrier injection, a more ideal spectral match to incident light from a CRT phosphor, and a higher average collection voltage. It was noted in Section II that the grading is accomplished for our CdS/CdTe charge storage diode structures by varying the substrate temperature during the CdS deposition process.

IV. PHOTOELECTRIC MEASUREMENT TECHNIQUE

The theory describing the charge storage CdS/CdTe diode has been qualitatively described in Section III. In the following sections we shall focus on the presentation of experimental data. First, data supporting the postulates of the charge storage diode model will be presented in Section V, and then data pertinent to display device operation will be presented in Section VI.

In this section, the measurement techniques used to acquire the data of the next sections are described. These techniques center around the idea of an equivalent circuit for the light valve device.

Figure 5A:
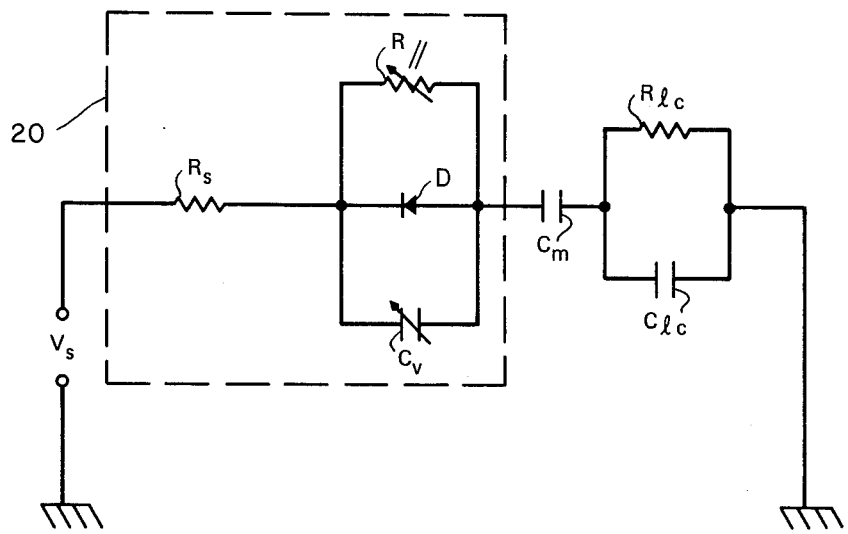
FIG. 5a is an equivalent circuit of a resolution element in the AC light valve. The portion in the dashed square 20 represents the CdS/CdTe photosensor element while the portion in series with this represents the impedances of the dielectric mirror and the liquid crystal elements.

The equivalent circuit for the AC light valve device is shown in FIG. 5a and consists of two parts, a light sensitive element and a set of passive components. The light sensitive element consists of the CdS photoactive layer overcoated by the electrically blocking CdTe contact layer, while the set of passive components consists of the dielectric mirror and the liquid crystal layer. The dielectric mirror is represented simply by an ideal capacitor $C_m$ and the liquid crystal layer is represented by a parallel resistor-capacitor combination $R_{lc} - C_{lc}$. The portion of this circuit inside the dashed line square 20 represents the photosensor, as described by the charge storage diode model of the CdS/CdTe light sensitive element. Series resistivity is represented by $R_s$ in the nondepleted region of CdS and $R_{\parallel}$ represents the residual resistivity of the CdS in the depleted region. The light and voltage variations of the depletion width capacity, $C_v$ has been described above. It has been assumed that $R_s \cong 0$ and $R_{\parallel} \cong \infty$. Diode D, of course, represents the junction formed between layers 7 and 6.

In our model of this structure, we hypothesize that light injects electron-hole pairs in the highly absorptive orange region of the CdS near the CdTe interface. The injected holes are captured almost immediately at recombination centers in the CdS, as would be the case for a photoconductor. However, the impedance of the photosensor is not controlled resistively but capacitively. The impedance is controlled by the back bias AC photocapacity associated with a depletion region that spreads from the CdS/CdTe interface. The width of this depletion region and therefore the photocapacitance is controlled by a modulation of the effective donor concentration by means of light injected electrons captured at shallow trap centers in the highly absorptive CdS region.

This photosensor model is similar to a photoconductor in that holes are captured in the CdS bulk. Thus, the substrate spectral response is near the CdS band edge and the device in AC operation exhibits gain. Gain occurs because an electron-hole pair may be separated more than once. In fact, electrons flow back and forth from the CdS/CdTe interface to the CdS/ITO interface under the influence of the alternating field (e.g., 2 kHz) several times until they recombine with holes at CdS recombination centers (e.g., 30 msec). These recombination events are governed by statistics similar to those of a photoconductor.

The photosensor is unlike a photoconductor in that the AC impedance is controlled by a photocapacitive element, not the photoresistivity. Like the photodiode, the device operates most of the time in back bias.

Figure 5B:
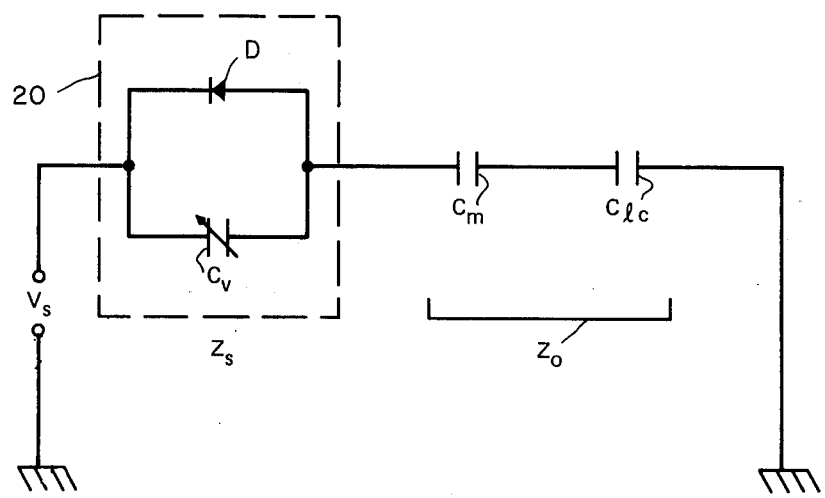
FIG. 5b is a simplification of the circuit in FIG. 5a which is a useful first approximation.
Figure 11:
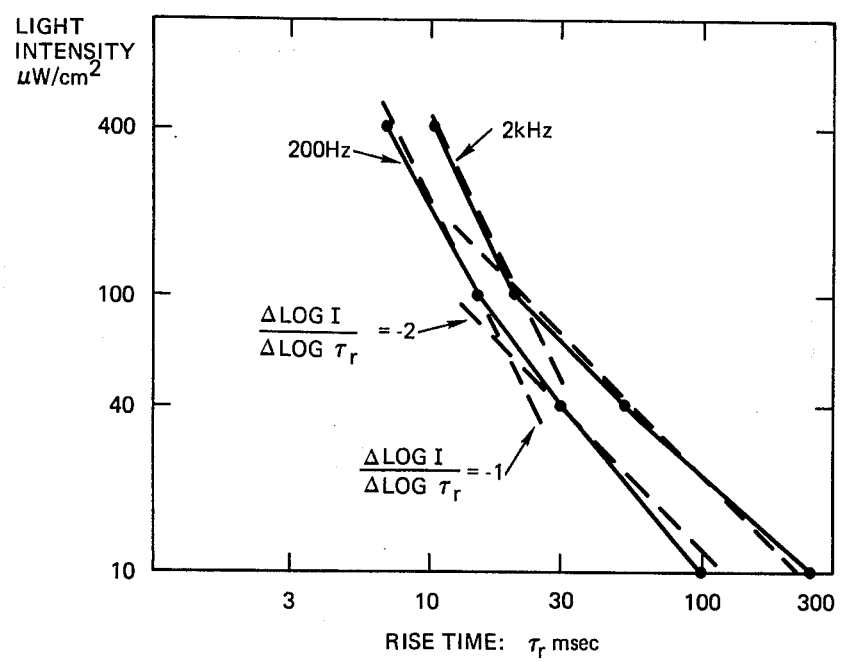
FIG. 11 is a graph in which the photocurrent rise time for a light valve is plotted versus photosensor illumination light intensity. Data are presented for operation at 200 Hz and 2 kHz. The dashed lines represent slopes of −1 and −2.
Figure 12:
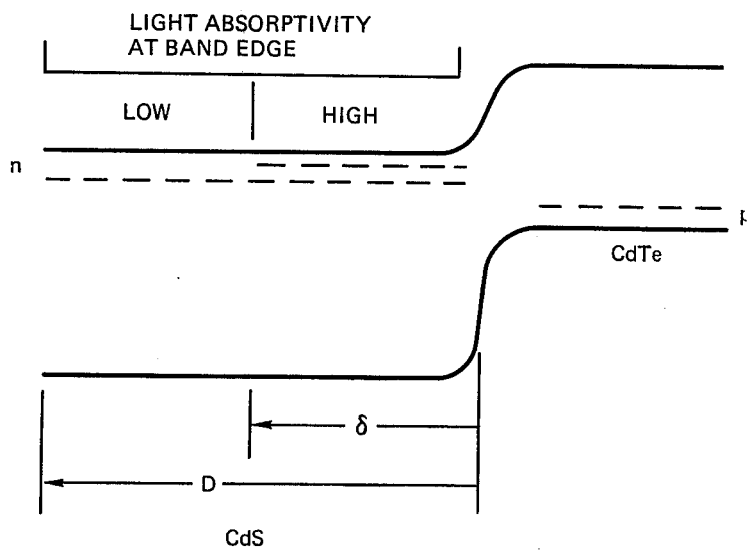
FIG. 12 is a band diagram for the charge storage diode structure. The higher absorption coefficient region of CdS near the CdTe interface acts as the major charge storage region.

The hypothesized charge storage diode model equivalent circuit is shown in detail in FIG. 5a and in simplified approximation in FIG. 5b. The band diagram for the device is shown in FIG. 11.

The photosensor performance data of Section V focus on the region of the equivalent circuit within the dashed line square 20. For this type of data, the passive equivalent circuit component effects ae minimized. This data is exemplified by experimental Q versus V curves similar to those of FIG. 4. The curves of FIG. 4 were used earlier to explain the operation of the charge storage diode. The samples used to collect experimental data consist of the standard ITO/CdS combination. However, the electrically blocking contact 6 is formed by a ½ cm² Ag paint contact, rather than the usual CdTe blocking contact layer. Tests have shown the two types of contacts to be equivalent. Experimentally, then, the Q versus V curves are taken by placing the ITO/CdS/Ag sample in series with a large capacitor and driving the combination with a 60 V peak saw tooth voltage wave form. Scope traces generate the Q versus V curves, then, when the scope y axis monitors the voltage on the large series capacitor while the scope x axis monitors the voltage supplied to the photosensor. The Q versus V curves ae measured at frequencies, light levels, and voltages of interest to device performance.

The gray scale and response time data of Section VI focus on the equivalent circuit for the whole light valve device. For the collection of these data, the ITO/CdS/Ag sample is set in series with impedances representing a dielectric mirror and a 4 μm thick liquid crystal layer. All impedance values are scaled to the ½ cm² Ag electrode contact area. This equivalent circuit data collection procedure has been found to be valid by comparing equivalent circuit data with actual liquid crystal light valve data.

V. VERIFICATION OF PRINCIPAL PHOTOSENSOR MODEL ASSUMPTIONS

First, it is important to verify the two principal assumptions made in the charge storage diode model set forth earlier. These are as follows:

a. That only light absorbed in the CdS film, not the CdTe, contributes to the diode stored charge.

b. That the AC capactive impedance associaed with the CdS diode depletion width is the dominant light dependent impedance component.

The first assumption is verified by the following experimental observations:

1. The peak diode spectral response lies at the CdS band edge and falls off rapidly in the red. The data of Table II is typical for AC light valve response. If electron hole pairs generated in the CdTe were important, red spectral respnse would be comparable to the green.

2. The high frequency switching ratio is higher than theoretical for unity gain and this switching ratio, to a first approximation, is independent of frequency. In fact, the theoretical unity gain switching ratio at 2 kHz, 100 μW/cm², and 50 V peak to peak is 1.1. This is much lower than observed (e.g., 1.77 from Table II); higher than unity gain and frequency independent characteristics follow naturally from the hypothesis of hole capture in CdS.

3. The Ag blocking contact is equivalent to the CdTe blocking contact. This implies again that the CdS film properties control the photosensor performance.

The second assumption that the depletion width photocapacity dominates Ac photosensor performance can be restated by referring to the generalized charge storage diode equivalent circuit shown in FIG. 5a. If this assumption is valid, then:

$$R_S << \frac{1}{\omega C_r}$$

and $$R_\parallel >> \frac{1}{\omega C_r}$$

Figure 6:
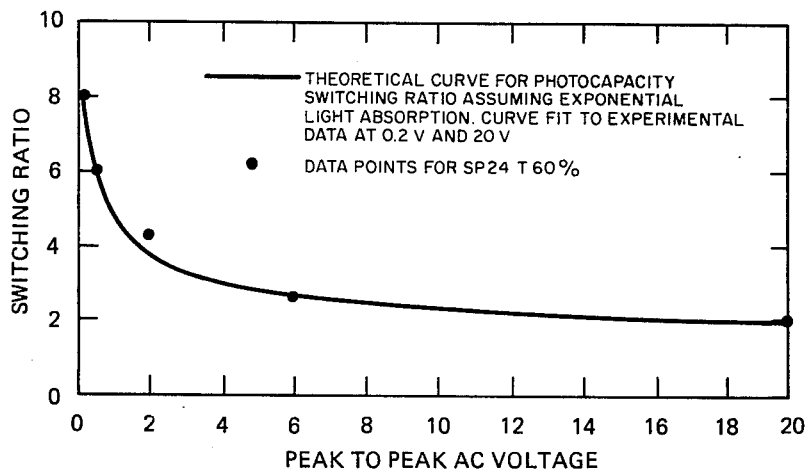
FIG. 6 is a graph showing switching ratio for a CdS film measured through a capacitive short as a function of peak to peak AC voltage amplitude at 200 Hz.

The quantity, $R_s$, represents the undepleted CdS film photoresistivity. From DC peak spectral response measurements utilizing ohmic contacts, an approximate value for $R_s$ can be calculated. From this computed value of $R_s$ from a photoconductor model, one would expect a diode switching ratio of better than 10 to 1 measured through a capacitive short if the capacitive depletion width could be ignored. Then, based on the charge storage diode model, one would expect the capacitive depletion width to become less important at lower voltages. Then the AC switching ratio should exceed 10 for a capacitive short as the applied peak-to-peak voltage approaches zero. This trend is observed, as is shown in FIG. 6. Furthermore, for a uniform stoichiometric film, one can assume exponential light absorption (e.g., F and $n_f$ fall off exponentially with distance from the ITO-CdS interface). Then a calculation using Maxwell's equation as for eqs. (2) and (3) of Table I, assuming an exponential $n_f$ distribution yields the theoretical switching ratio curve in FIG. 6. This switching ratio is calculated assuming that the capacitive depletion width impedance dominates $R_s$. So then, the photocapacity dominates $R_s$ at 200 Hz. This is also true at high frequency and high light levels.

Figure 7:
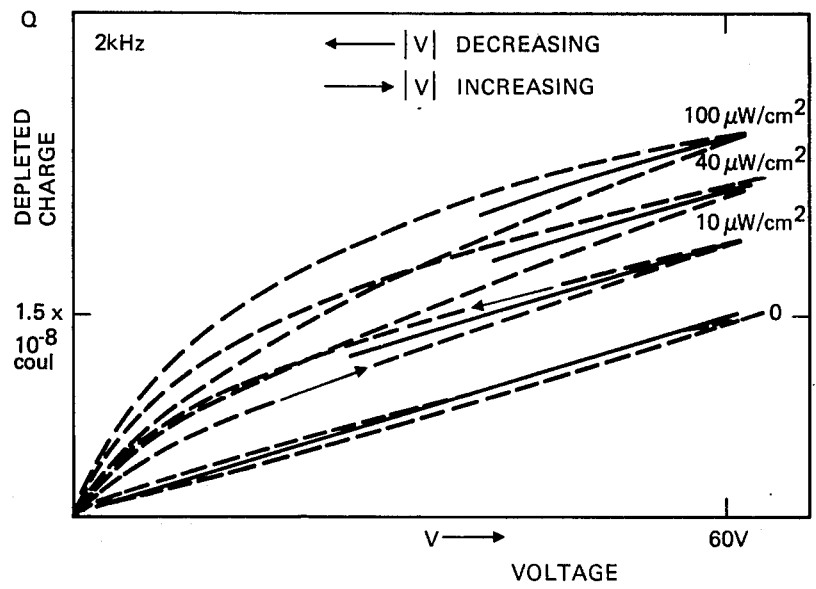
FIG. 7 is a graph showing experimental plate charge versus back bias voltage curves at 2 kHz. Light intensity is the curve family parameter.

The assumption that $R_\parallel >> 1/\delta C_v$ can be shown to be valid by comparing experimentally measured Q versus V curves for a cell with the theoretical Q versus V curves of FIG. 4. Experimental Q versus V curves are shown in FIG. 7 for 2 kHz and varying light levels. These curves show a small hysteresis from the increasing to decreasing voltage cases. However, the averaged curves correlate well with the curves of FIG. 4. The observed hysteresis effect results from a finite $R_\parallel$. Physically, $R_\parallel$ represents the residual resistivity of the depleted portion of the CdS film. $R_\parallel$ is finite in this region because, even though the shallow centers are empty, carriers may still be injected in the depleted region by light absorption and by deep trap level emptying. This carrier injection in the depletion region leads to hysteresis because recombination occurs only when electrons and holes are together in the bulk of the film and this occurs mainly near zero voltage. So, plate charge accumulation from carrier injection via light absorption and deep trap emptying lead to a larger charge for larger delay time intervals as measured fom the zero voltage region. Thus, more charge is accumulated for the |V| decreasing case than for the |V| increasing case as is seen in FIG. 7.

However, even given the existing hysteresis, the statement that $R_{\parallel} \gg 1/WC_r$ is still a good working first approximation. This follows because the low light level hysteresis charge is prsently no more than approximately 20% of the shallow center charge, and as the films improve, i.e., as the deep trap center density decreases, the hysteresis charge will decrease.

VI. PHOTOSENSOR RELATED LIGHT VALVE PERFORMANCE DATA

In the last section, the focus was on the narrow objective of charge storage diode nodal verification. In this section, the focus shifts and broadens. Our objectives here are threefold.

First, we wish to present photosensor data pertinent to light valve display operation. This has not been presented previously and is of some interest. For example, the response time data show that the photosensor device is capable of near television rate (TV) operation.

Second, we wish to show that these display device data correlate well with the model.

Third, we wish to show that the small deviations from the model can be attributed to the presence of more than one deep trap level, and therefore, improvements in the polycrystalline CdS film quality will lead to a closer agreement with the model.

A. Gray Scale Data

As discussed earlier, experimental Q versus V curves were recorded via scope trace photos with a small impedance series capacitor. These data were rcorded at 200 Hz and 2 kHz. The average traces are shown in FIGS. 8 and 9 for a ½ cm² metal contact.

Next, impedances corresponding to a 4 μm liquid crystal layer (scaled to the ½ cm² contact area) were switched into the circuit (forming an AC light valve equivalent circuit) and equilibrium peak current switching ratios were measured at various light levels. Finally, straight lines wer drawn on the averaged Q versus V curves representing the photosensor load curves. These straight lines were drawn to conform to measured saturated light switching ratios. From the straight line intersections on the Q versus V curves, predicted gray scale switching ratios were determined. These predicted gray scale data are compared in Table III with the measure equilibrium switching ratios. It can be seen from Table III that theory and measurement agree very well.

Figure 8:
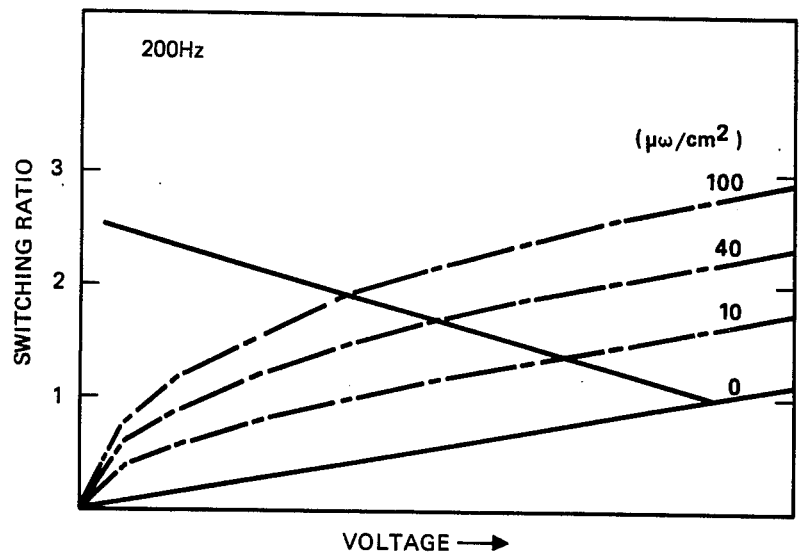
FIG. 8 is a graph showing averaged experimental Q versus V curves for the exemplary charge storage diode at 200 Hz. The straight line crossing the Q versus V family of curves represents the charge storage diode/-light valve operating curve as shown in eq. (4), Table 1.
Figure 9:
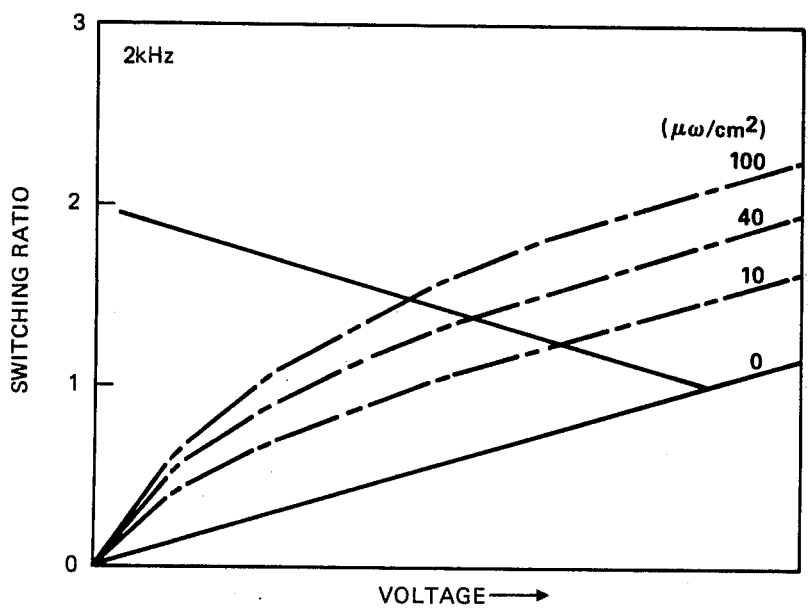
FIG. 9 is a graph showing averaged experimental Q versus V curves for the charge storage diode at 2 kHz. The straight line crossing the Q versus V family of curves represents the charge storage diode/light valve operating curve as shown in eq. (4), Table 1.

Also, from the light intensity information in the Q versus V family of curves of FIGS. 8 and 9, it is possible to check the validity of the quadratic $Q_\delta$ versus F dependence shown in eq. 5 of Table I in FIG. 13. This is done by plotting log $Q_\delta$ versus log F in FIG. 10. Agreement with the predicted slope of 2 is reasonably good. The deviation at high light levels can be explained as follows: Recall that $\alpha$ is the fractional portion of a period for which an electron remains free in the CdS film before being swept to the electrode. This sweep out time will be inversely proportional to the drift velocity. In a photoconductor with a multitude of traps, the drift velocity increases at higher light levels. [R. H. Bube and H. E. Macdonald, Phys. Rev. 121, 473 (1961).] This phenomenon will lead to a decrease in $\alpha$ at a high light levels and a slope larger than 2 as observed in FIG. 10. However, this effect can be regarded as a higher order perturbation on the charge storage diode model.

B. Response Time Data

Photosensor response times can be measured from the equivalent circuit peak current envelope curve traces as substrate illumination light is turned on or off. Table IV of FIG. 16 shows the equivalent circuit measured time response data for 2 kHz.

It is of interest to compare the measured time response data of Table IV with the predications of eq. (6) and (7) from Table I.

On Time

Figure 10:
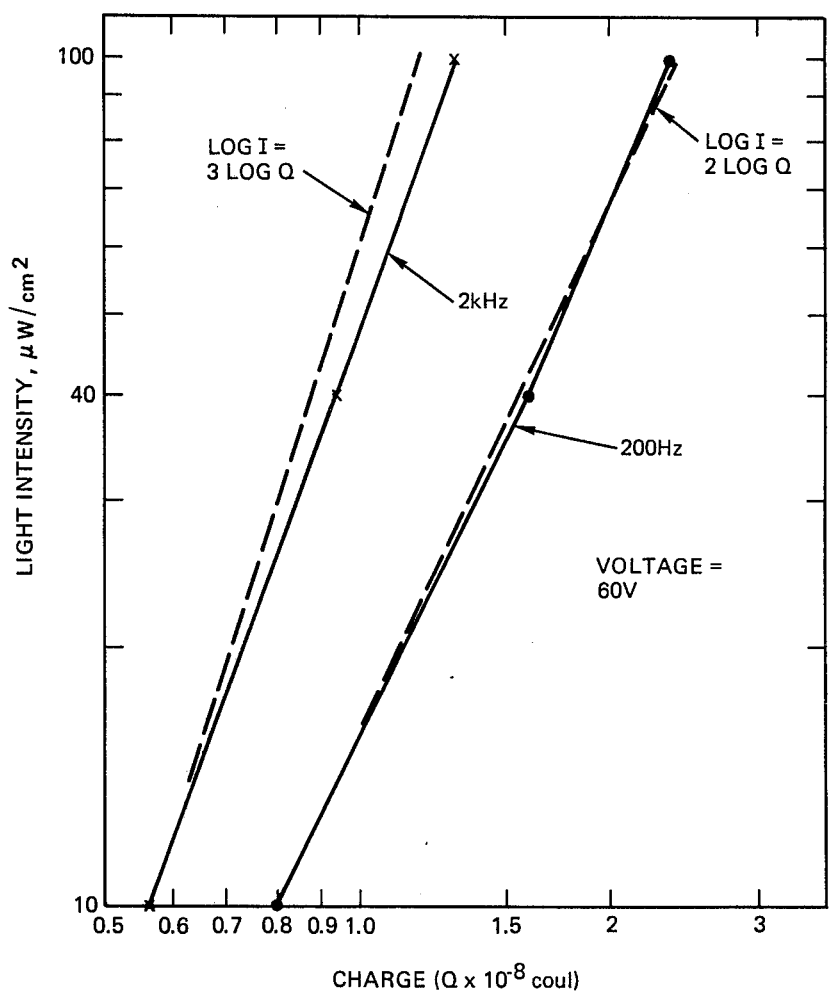
FIG. 10 is a graph in which the depleted charge is plotted versus illumination intensity for a charge storage diode. Data are presented for diode opration at 200 Hz and 2 kHz. The dashed lines represent constant slopes of 2 and 3.

Note that, for the two trap level systems described in Table I, the $(n_s\alpha)$ versus $F^{1/2}$ dependence in eq. (5) combines with the $\tau_{rise}$ versus $(n_s\alpha)^{-1}$ dependence in eq. (6) to predict a $\tau_{rise}$ versus $F^{-1/2}$ dependence. This implies that a plot of the experimental log I versus log $\tau_{rise}$ data should show a slope of $-2$. These data are shown in FIG. 10 for the 2 kHz case. Data points for the 200 Hz rise time case are also shown. In each case, the $-2$ slope dependence exist for the data above 100 μW/cm², but a clear anomaly exists for the data below this light level. The low light level data fits more nearly a curve with a $-1$ slope. This $-1$ slope can occur if a second deep electron trap level exists in the sputtered CdS films.

The $-1$ slope is explained as follows: Eq. (6) in Table I FIG. 13 describes the photosensor rise time. This equation was derived by noting that the rise time is simply the time needed to charge the CdS/CdTe charge storage diode. As the major charge element arises from the filling of deep trap levels, the time is simply $n_s/F$. The problem is to describe $n_s$. In the two electron trap level model, the deep trap level population is a function of F and in fact varies as $F^{1/2}$. However, if the dark state Fermi level is quite deep and the films possess a multitude of deep levels, then the lower deep levels must be nearly filled before the shallow centers can fill sufficiently to greatly affect the depletion width. If $N_{ss}$ represents the trapped electron density, then $n_s$ in the expression for rise time becomes $N_{ss}$. This $N_{ss}$ is approximately the lower deep trap center density, and thus, is not a function of F. Thus, the rise time should vary as $F^{-1}$. This explains the $-1$ slope observed for the lower light level data in FIG. 11.

Off Time

Turning now to the photosensor decay time, note that there are two cases implicit in eq. (7) of Table I. Decay can be dominated by recombination or by detrapping. Where the decay time is controlled by detrapping, eq. (7) predicts a constant decay time, $P_s^{-1}$, independent of light level. This apparently describes the data at 2 kHz.

VII. CONCLUSIONS

The preponderance of data presented in the previous sections supports the charge storage diode model presented. Some derivations from the simple three-level model were observed. These experimental deviations can be summarized as follows:

a. Q versus V curve hysteresis.

b. A prolonged low light level turn-on time.

c. Problems with drift velocity variations with light intensity and applied AC frequency.

We have noted that these deviations can be regarded as arising from a multitude of deep electron trap levels in the CdS films.

The fact that we have developed a viable model to describe the AC photoresponse of CdS/CdTe photosensors allows us to reach the following outstanding conclusion: To the extent that the deep trap density in films can be reduced, the expected benefits for a display device are:

Faster turn-on time, and
Higher sensitivity.

This conclusion still stands even given the observed deviations.

The extent to which sensitivity and turn-on time can be improved can be quantified by evaluating the present level of performance. Thus, from the data of FIG. 8 for the 40 $\mu W/cm^2$ curve, the shallow trap (mobile) charge, $n_f$ can be calculated. We find for that case $n_f = 3 \times 10^{14}$ elec/cm$^3$. From the measured 30 msec on time for 40 $\mu W/cm^2$ and 200 Hz from FIG. 11, we calculate the stored charge in deep trap centers to be $10^{16}$ elec/cm$^3$. The conclusion is that the effective charge, $3 \times 10^{14}$/cm$^3$, is only 3% of the stored charge, $10^{16}$/cm$^3$; only 3% of the injected charge is effective. Considerable room for improvement exists. This improvement can be realized by minimizing deep trap densities. This in turn can be done by producing a graded absorption structure by utilizing graded band gap films of, for example, $CdS_{1-x}Se_x$.

It will, of course, be understood that the above described conceptual model has been verified by analysis using techniques of mathematical physics which analysis has lead to the equations set forth in Table I. Such techniques are well known to those skilled in the art. A comparison of the experimental results utilized therein with a qualitative statement of the model has been presented.

What is claimed is:

1. A photodiode for an alternating current driven light valve of the type wherein the photocapacitance of a light responsive semiconductor layer of said diode which is supported on a transparent substrate of said valve to receive light transmitted therethrough can be modulated in response to changes in the intensity of such incident light, the improvement in said diode comprising:
    a. first and second semiconductor layers forming the rectifying junction of a charge storage photodiode;
    b. said first layer being a light responsive photoconductor the photocapacitance of which can be modulated in response to changes in the intensity of said incident light and being located between said second layer and said substrate, and said second layer being a semiconductor having an impurity type opposite to that of said first layer;
    c. said first layer having a defect center gradient from a first region of semiconductor material having a low density of defect centers to a second region of semiconductor material having a higher density of defect centers, said second region being contiguous with said junction and said first region being contiguous with said second region and being exposed to receive said incident light which is effective to generate charge carriers which are stored in said second region and which change the photocapacitive depletion width adjacent said junction to enhance the sensitivity of said diode; and,
    d. a voltage or field activated light modulating medium adjacent said second layer on the side opposite the first layer, said medium and said first and second layers being sandwiched between a pair of transparent electrodes.

2. A device as in claim 1 wherein said first region is thicker than said second region whereby the dark current may be minimal.

3. A device as in claim 1 wherein the defect concentration of said first layer is varied from low in said first region to high in said second region by progressively lowering the temperature of said substrate during deposition of said first layer on said substrate.

4. A device as in claim 3 wherein the semi-conductor material of both regions of said first layer is cadmium sulfide and wherein said defect centers comprise both shallow electron traps and recombination centers, said density of defect centers being varied by said variation of temperature during deposition of said regions.

5. A device as in claim 4 wherein said first layer has a graded optical absorption coefficient which varies across its thickness, said first region having a low optical absorption coefficient and said second region having a higher optical absorption coefficient due to said higher density of shallow electron traps.

6. A device as in claim 1 wherein said second relatively high defect density region is the result of the formation of a chemical alloy in said region with the semiconductor of said first region thus varying the band gap of the device from said first low defect density region to said second high defect density region, said defect centers including the atoms of said alloying material.

7. A device as in claim 6 wherein said first region is more stoichiometric than said second region.

8. A device as in claim 7 wherein said first layer comprises a first region of CdS and a second region of $CdS_{1-x}Se_x$ and wherein said second region of said layer is formed by alloying CdS with CdSe creating a relatively "orange" region compared to the first region which is a "yellow" pure CdS region.

9. A device as in claim 8 wherein said first layer has a graded optical absorption coefficient which varies across its thickness, said first region having a low optical absorption coefficient and said second region having a higher optical absorption coefficient.

10. A device as in claim 8 wherein said first layer is formed by reactively sputtering CdS on to said substrate initially in an $H_2S$ atmosphere and finally in an $H_2Se$ atmosphere.

11. A device as in claim 8 wherein said first region is formed by reactively sputtering CdS on to said substrate from a first target and then reactively sputtering $CdS_{1-x}Se_x$ from a second target on to said first region to form said second region.

12. A device as in claim 8 wherein said first and second regions are respectively formed by dual boat evaporation followed by heat treatment in a hydrogen sulfide atmosphere, said first evaporation depositing a first region of CdS and said second evaporation depositing a second region of $CdS_{1-x}Se_x$.

13. A device as in claim 1 wherein said first region is at least twice as thick as said second region whereby the dark current of said device is reduced.

14. A device as in claim 1 wherein said first region is at least 12 $\mu m$ thick and said second region is at least 4 $\mu m$ thick.

15. A device as in claim 1 wherein said photosensor has a broad spectral response with non-exponential carrier generation and low recombination velocities.

16. A device as in claim 15 wherein said spectral response substantially matches that of a P-1 phosphor of a commercial cathode ray tube.

* * * * *